(12) United States Patent
Zhang et al.

(10) Patent No.: US 12,359,299 B2
(45) Date of Patent: Jul. 15, 2025

(54) BACK PLATE

(71) Applicant: KunShan Go-Visionox Opto-Electronics Co., Ltd, Jiangsu (CN)

(72) Inventors: Dingcheng Zhang, Jiangsu (CN); Shuijun Wang, Jiangsu (CN); Weili Li, Jiangsu (CN); Botao Fan, Jiangsu (CN); Wenxing Li, Jiangsu (CN); Fei Sun, Jiangsu (CN); Xiaogang Xin, Jiangsu (CN)

(73) Assignee: KunShan Go-Visionox Opto-Electronics Co., Ltd., Kunshan (CN)

( * ) Notice: Subject to any disclaimer, the term of this patent is extended or adjusted under 35 U.S.C. 154(b) by 536 days.

(21) Appl. No.: 17/824,188

(22) Filed: May 25, 2022

(65) Prior Publication Data

US 2022/0285622 A1    Sep. 8, 2022

Related U.S. Application Data

(63) Continuation of application No. PCT/CN2021/087284, filed on Apr. 14, 2021.

(30) Foreign Application Priority Data

Jun. 30, 2020   (CN) .......................... 202010622914.7

(51) Int. Cl.
*H01L 51/00* (2006.01)
*C23C 14/04* (2006.01)
(Continued)

(52) U.S. Cl.
CPC .......... *C23C 14/042* (2013.01); *C23C 16/042* (2013.01); *H10K 71/00* (2023.02); *H10K 71/166* (2023.02)

(58) Field of Classification Search
None
See application file for complete search history.

(56) References Cited

U.S. PATENT DOCUMENTS 3,874,916 A * 4/1975 Livesay .................... G03F 1/78
                                                          428/323
11,905,590 B2 * 2/2024 Donoghue ............ C23C 14/048
(Continued)

FOREIGN PATENT DOCUMENTS

CN           1622707 A      6/2005
CN         104726821 A      6/2015
(Continued)

OTHER PUBLICATIONS

Office Action issued on Jan. 25, 2022, in connection with corresponding Chinese Application No. 202010622914.7 (11 pp., including machine-generated English translation).
(Continued)

*Primary Examiner* — Jethro M. Pence
(74) *Attorney, Agent, or Firm* — Maier & Maier, PLLC

(57) ABSTRACT

A back plate configured to press a mask assembly. The mask assembly includes a glass substrate and a mask that are stacked on the glass substrate. The back plate covers a surface of the glass substrate to press the glass substrate, thereby attaching the glass substrate to the mask. The back plate includes a bottom plate and multiple protrusions, the multiple protrusions include multiple bottom plate protrusions disposed on a side of the bottom plate facing the glass substrate. The multiple bottom plate protrusions are arranged in an array. Orthographic projections of the bottom plate protrusions on a plane of the mask fall within the mask. A distance between the projections of the bottom plate protrusions disposed adjacent to an edge of the mask and the edge of the mask is greater than or equal to a preset distance.

20 Claims, 3 Drawing Sheets

(51) Int. Cl.
  *C23C 16/04*  (2006.01)
  *H01L 51/56*  (2006.01)
  *H10K 71/00*  (2023.01)
  *H10K 71/16*  (2023.01)

(56) References Cited

U.S. PATENT DOCUMENTS

| | | | | |
|---|---|---|---|---|
| 2006/0087226 | A1* | 4/2006 | Miura | H10K 71/166 |
| | | | | 313/503 |
| 2022/0033953 | A1* | 2/2022 | Zhang | C23C 14/24 |

FOREIGN PATENT DOCUMENTS

| | | | |
|---|---|---|---|
| CN | 106328831 | A | 1/2017 |
| CN | 206250222 | U | 6/2017 |
| CN | 107604326 | A | 1/2018 |
| CN | 107881464 | A | 4/2018 |
| CN | 207468713 | U | 6/2018 |
| CN | 108400256 | A | 8/2018 |
| CN | 109837504 | A | 6/2019 |
| CN | 110055497 | A | 7/2019 |
| CN | 110295346 | A | 10/2019 |
| CN | 111850464 | A | 10/2020 |
| JP | H09170081 | A | 6/1997 |

OTHER PUBLICATIONS

International Search Report (with English Translation) and Written Opinion (with English Translation) issued on Jul. 12, 2021 in corresponding International Patent Application No. PCT/CN2021/087284; 14 pages.

\* cited by examiner

BACK PLATE

CROSS REFERENCE TO RELATED APPLICATIONS

The present application is a continuation-application of International (PCT) Patent Application No. PCT/CN2021/087284, filed on Apr. 14, 2021, which claims the priority of Chinese Patent Application No. 202010622914.7, filed on Jun. 30, 2020, in the China National Intellectual Property Administration, the entire contents of which are hereby incorporated by reference in their entireties.

TECHNICAL FIELD

The present disclosure relates to the field of displaying technologies, and in particular to a back plate.

BACKGROUND

With the development of displaying technologies, there is increasingly demanding for display panels in market. Organic light emitting diode display panels have been more and more widely applied because of high contrast, self-illumination and flexible display. At present, a mask deposition technology has been generally applied for manufacturing an organic light emitting diode. During the deposition process, attachment accuracy of mask may directly affect the product yield.

SUMMARY

The present disclosure provides a back plate configured to press a mask assembly, the mask assembly includes a glass substrate and a mask, the back plate includes a bottom plate and a plurality of protrusions, and the plurality of protrusions include a plurality of bottom plate protrusions; wherein the mask is stacked on the substrate, back plate covers a surface of the glass substrate to press the glass substrate, thereby attaching the glass substrate to the mask, the plurality of bottom plate protrusions are disposed on a side of the bottom plate facing to the glass substrate, the plurality of bottom plate protrusions are arranged in an array, orthographic projections of the plurality of bottom plate protrusions on the mask fall within the mask, and a distance between projections of the plurality of bottom plate protrusions disposed adjacent to an edge of the mask and the edge of the mask is greater than or equal to a preset distance. The deformation of the corresponding glass substrate around the inner edge of the frame of the mask is reduced, and the attachment effect between the glass substrate and the mask is improved, thereby increasing the product yield.

DETAILED DESCRIPTION

The present disclosure will be further described referring to accompanying drawings and embodiments. It should be understood that specific embodiments described herein are only used to explain the present disclosure, but not to limit the present disclosure. In addition, it should be noted that, for the convenience of description, the drawings only show some but not all structures related to the present disclosure.

During a deposition process of a mask, it is necessary to the press a mask and a glass substrate through a back plate, so that the mask and the glass substrate are attached and aligned accurately. Specifically, the glass substrate is disposed between the back plate and the mask. A plurality of protrusions are arranged in an array on a surface of the back plate close to the glass substrate. The protrusions are in contact with the glass substrate, and the back plate may apply a pressure to the glass substrate so that the glass substrate is attached to the mask. It has been found that, in the related art, a vertical distance between protrusions disposed adjacent to an edge portion of the back plate and an edge of mask is relatively close, which may cause a deformation of a part of the glass substrate facing a surrounding of an inner edge of a frame of the mask. In this way, the mask may be deformed, which may cause a poor attachment between the glass substrate and the mask, thereby decreasing the product yield during deposition. In addition, when projections of the protrusions on a plane parallel to the mask and a projection of the edge of the mask on the plane parallel to the mask are too close in distance, the attachment effect between an effective deposition region of the mask and the glass substrate may also be poor, which has not been yet found before the filing of the present disclosure. The present disclosure provides a back plate. A vertical distance between the protrusions disposed adjacent to the edge of the back plate and the edge of the mask is greater than or equal to a preset distance to reduce the deformation of the part of the glass substrate facing the surrounding of the inner edge of the frame of the mask and improve the attachment effect of the glass substrate and the mask, thereby increasing the product yield.

The technical solutions of the present disclosure will be described in detail below through specific embodiments.

Figure 1:
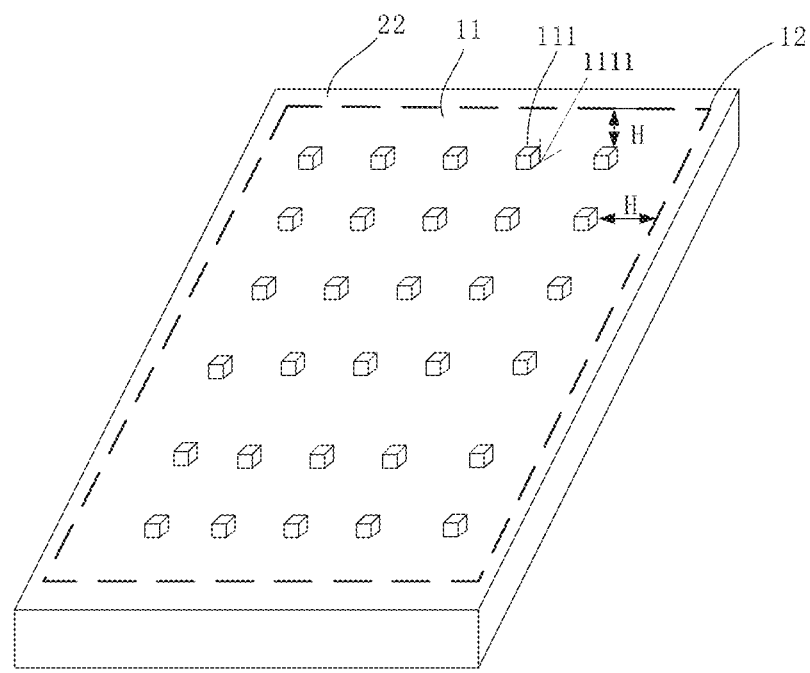
FIG. 1 is a structural schematic view of a back plate according to an embodiment of the present disclosure.

FIG. 1 a structural schematic view of the back plate according to an embodiment of the present disclosure. The back plate 22 in the embodiment includes a bottom plate 11. A plurality of protrusions are disposed on a side of the bottom plate 11 facing to a glass substrate. The protrusions include a plurality of bottom plate protrusions 111. The bottom plate protrusions 111 may also be referred to as main plate protrusions. Orthographic projections 1111 of the plurality of bottom plate protrusions 111 on a plane of the mask 12 falls within the mask 12. In some embodiments, orthographic projections 1111 of the plurality of bottom plate protrusions 111 on a plane of the mask 12 completely falls within the mask 12. A vertical distance H between a projection 1111 of one of the bottom plate protrusions 111 disposed adjacent to an edge of the mask 12 and the edge of the mask 12 is greater than or equal to a preset distance.

Figure 2:
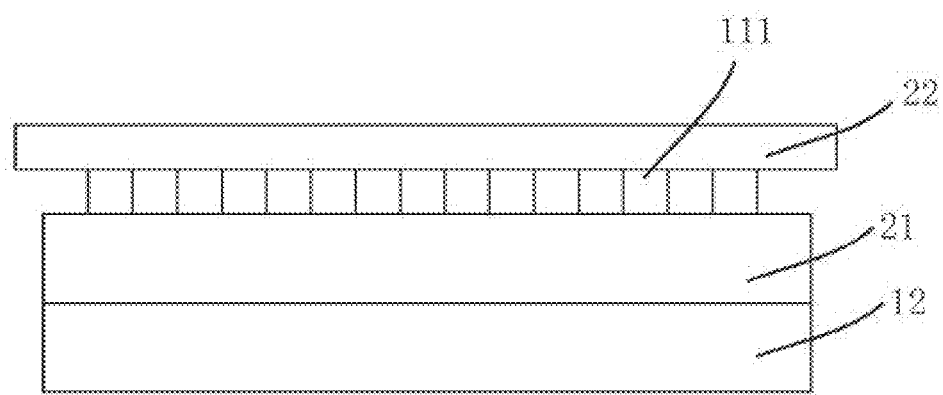
FIG. 2 is a structural schematic view of a positional relationship of a back plate, a glass substrate, and a mask according to an embodiment of the present disclosure.

The back plate 22 in the present disclosure is configured to press the mask 12 and the glass substrate 21. As shown in FIG. 2, the back plate 22 is disposed on a side of the glass substrate 21 away from the mask 12 when the mask 12 and the glass substrate 21 are pressed by the back plate 22. That is, the glass substrate 21 is disposed between the back plate 22 and the mask 12. The laminated glass substrate 21 and mask plate 12 may be called a mask assembly. That is, the back plate 22 is configured to press the mask assembly, and the back plate 22 covers a surface of the glass substrate 21 away from the mask 12 to press the glass substrate 21, so that the glass substrate 21 is attached to the mask 12.

When the vertical distance H between the bottom plate protrusions 111 disposed adjacent to the edge of the back plate 22 and the edge of the mask is small, the bottom plate protrusions 111 disposed adjacent to the edge of the back plate 11 are required to be removed to meet a requirement that the distance H between the projection 1111 of the bottom plate protrusion 111 disposed adjacent to the edge of the mask 12 and the edge of the mask 12 is greater than or equal to the preset distance. In this way, the bottom plate projections 1111 disposed adjacent to the above-mentioned removed bottom plate projections 1111 disposed adjacent to the edge of the back plate 22 are taken as new bottom plate projections 1111 disposed adjacent to the edge of the back plate 22. In some embodiments, it can be understood that the distance H between the bottom plate protrusions 111 disposed adjacent to a left edge or a right edge of the back plate 22 and the edge of the mask 12 is required to be greater than or equal to the preset distance. In other embodiments, the distance H between bottom plate protrusions 111 disposed adjacent to an upper edge or a lower edge of the back plate 22 and the edge of the mask 12 may be set to be greater than or equal to the preset distance, which is not specifically limited.

Specifically, when it is required that the distance H between the bottom plate protrusions 111 disposed adjacent to the left or the right edge of the back plate 22 and the edge of mask 22 is greater than or equal to the preset distance, the bottom plate protrusions 111 disposed adjacent to the edge of bottom plate 11 may be removed. In this way, the bottom plate projections 1111 disposed adjacent to the above-mentioned removed bottom plate projections 1111 disposed adjacent to the edge of the back plate are taken as the new bottom plate projections 1111 disposed adjacent to the edge of the back plate 22. When it is required that the distance H between the bottom plate protrusions 111 disposed adjacent to the upper or the lower edge of the back plate 22 and the edge of the mask 22 is greater than or equal to the preset distance, the bottom plate protrusions 111 disposed adjacent to the edge of bottom plate 11 may be removed. In this way, bottom plate projections 1111 disposed adjacent to the above-mentioned removed bottom plate projections 1111 disposed adjacent to the edge of the back plate are taken as the new bottom plate projections 1111 disposed adjacent to the edge of the back plate 22.

Specifically, in some embodiments, the bottom plate protrusions 111 on the bottom plate are arranged in an array and uniformly disposed, so that a pressure applied on the glass substrate 21 is uniform. In specific embodiments, each of the bottom plate protrusions 111 may be a cube with a length of 3-4 mm. In some embodiments, each of the bottom plate protrusions 111 may be a cuboid with a width of 3-4 mm, and a length is slightly greater than the width. The bottom plate protrusions 111 may be made of aluminum alloy material.

In some embodiments, the preset distance may be 3 mm. That is, the distance H between the bottom plate protrusion 111 disposed adjacent to the edge of the back plate 22 and the edge of mask 12 may be set to be greater than or equal to 3 mm. In some embodiments, the vertical distance H between the projections 1111 of the bottom plate protrusions 111 disposed adjacent to the edge of the back plate 22 on the mask 12 and the edge of the mask may be set to be greater than or equal to 3 mm and less than or equal to 20 mm.

Specifically, in some embodiments, a plurality of rows or columns of bottom plate protrusions 111 disposed adjacent to the edge of the back plate 22 may be removed, so that the vertical distance H between the bottom plate protrusion 111 disposed adjacent to the edge of back plate 22 and the edge of the mask 12 may be set to be greater than or equal to the preset distance or less than or equal to 20 mm. The specific solution depends on a distance between the two adjacent bottom plate protrusions 111, which is not limited.

In the present disclosure, it has been proved by experiments that, by setting the vertical distance H between the bottom plate protrusion 111 disposed adjacent to an outermost edge and the edge of the mask 12 to be greater than or equal to the preset distance. In this way, the deformation of a part of the glass substrate 21 facing the surrounding of the inner edge of the frame of the mask 12 may be reduced, the attachment effect of the glass substrate 21 and the mask 12 may be improved, the product yield may be greatly increased during the deposition of the mask 12. Specifically, it has been proved by experiments that, when the method of the present disclosure is applied, the product yield is increased by 40% during deposition, and an economic value according to the capacity of production is considerable. In addition, the typesetting rate is also improved to a certain extent during deposition. Specifically, it has been proved by experiments that, when the method of the present disclosure is applied, a typesetting rate is increased by about 20% and cost is reduced.

Figure 3:
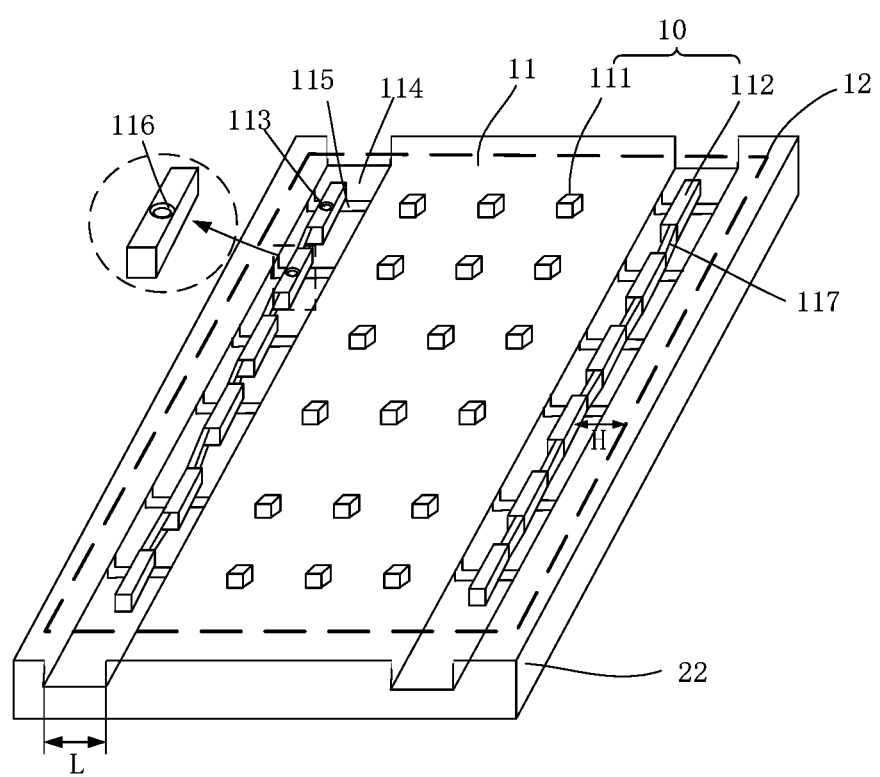
FIG. 3 is a structural schematic view of a back plate further defining grooves and disposed with first protrusions based on the back plate shown in FIG. 1.

FIG. 3 is a structural schematic view of the back plate according to another embodiment of the present disclosure. As to the embodiments illustrated in FIG. 3, the back plate 22 further defines two grooves 114 and is arranged with a plurality of first protrusions 112 based on the embodiment shown in the FIG. 1. In some embodiments, the back plate 22 may define at least one groove 114 and be arranged with at least one first protrusion 112. Specifically, the back plate 22 shown in the FIG. 3 includes the bottom plate 11. A side of the bottom plate 11 facing the glass substrate 21 is arranged with a plurality of protrusions 10 arranged in an array. The plurality of protrusions 10 disposed on the bottom plate 11 include a plurality of first protrusions 112 disposed adjacent to an edge and a plurality of bottom plate protrusions 111 disposed on other positions except the position adjacent to an edge portion of the bottom plate 11. A groove 114 is defined corresponding to a position of the plurality of first protrusions 112. Specifically, the first protrusions 112 disposed adjacent to the edge are slidably disposed in the groove 114. The first protrusions 112 may slide along an edge of the groove 114 so that the vertical distance H between the first protrusion 112 and the edge of the mask 12 is greater than or equal to a preset distance.

Specifically, the groove 114 is defined in the edge of the back plate 22 so that the first protrusions 112 disposed adjacent to the edge of the back plate 22 may slide in the groove 114 to adjust the vertical distance between the first protrusions 112 disposed adjacent to the edge of the back plate 22 and the edge of the mask 12.

In some embodiments, a threaded groove 115 is defined in the groove 114. As shown in FIG. 3, the threaded groove 115 is defined in the groove 114 and along a width L direction of the groove 114. Specifically, the number of the threaded grooves 115 is the same as the number of the first protrusions 112 disposed adjacent to the edge portion of the bottom plate 11. Each of the first protrusions 112 correspondingly moves along the width L direction of the groove 114. When moved to a predetermined position, each of the first protrusions 112 may be fixed at a position of a corresponding threaded groove 115. Specifically, the threaded groove 115 defined in the groove 114 extends along a direction intersected with an extending direction of the groove 114. Specifically, a shape of an opening of the threaded groove 115 may be a rectangle or an ellipse. Specifically, when the threaded groove 115 is a rectangle, a length of the threaded groove 115 is the same as the width L of the groove 114. When the threaded groove 115 is elliptical, a length of a long axis of the threaded groove 115 is equal to the width L of the groove 114. In specific embodiments, the threaded groove 115 penetrates through the bottom plate 11, or the thread groove 115 dose not penetrate through the bottom plate 11, which is not specifically limited.

In some embodiments, a threaded hole 113 is defined in the first protrusions 112. Specifically, when a corresponding threaded groove 115 is a rectangle, a diameter of the threaded hole 113 is equal to a width of the threaded groove 115. When the corresponding threaded groove 115 is elliptical, a diameter of the threaded hole 113 is equal to a length of a minor axis of the threaded groove 115. When the first protrusion 112 slides along the groove 114 to the predetermined position, a screw passes through the threaded hole 113 defined on the first protrusion 112 and is inserted into the threaded groove 115 defined in the groove 114, so that the first protrusion 112 is fixed on the bottom plate 11. Specifically, in some embodiments, the width of the threaded groove 115 defined in the groove 114 is the same as an internal diameter of the threaded hole 113 defined in the first protrusion 112. In addition, the thread groove 115 defined in the groove 114 and the threaded hole 113 defined in the first protrusion 112 have a same threaded rotation direction. The predetermined position is a position at which the vertical distance H from the edge of the mask 12 is greater than or equal to the preset distance. Specifically, the predetermined position is a position at which the vertical distance H from the edge of the mask 12 is greater than or equal to 3 mm. Furthery, the predetermined position is a position at which the vertical distance from the edge of the mask 12 is greater than or equal to 3 mm and less than or equal to 20 mm.

In some embodiment, when the screw penetrates through the threaded hole 113 defined on the first protrusion 112 and is inserted into the thread groove 115 defined in the groove 114, and the first protrusion 112 is fixed on the bottom plate 11, the screw does not protrude from a surface of the first protrusion 112. That is, when the glass substrate 21 is pressed, the screw does not contact with the glass substrate 21 to prevent the glass substrate 21 being damaged. Specifically, a length of the screw is less than a sum of depths of the threaded hole 113 defined in the first protrusion 112 and the thread groove 115 defined in the groove 114. In some embodiments, the length of the screw is less than the sum of the depths of the threaded hole 113 defined in the first protrusion 112 and the threaded groove 115 defined in the groove 114, and a surface of the first protrusion 112 away from the bottom plate 11 define receiving groove 116 at a position corresponding to the threaded hole 113. When the screw is inserted into the threaded hole 113 and the threaded groove 115, a head of the screw is accommodated in the receiving groove 116, so that the screw does not protrude from the surface of the first protrusion 112, thereby preventing the screw from contacting with the glass substrate 21.

In specific embodiments, the width L of the groove 114 is greater than or equal to 5 mm. It can be understood that the length of the thread groove 115 may also be greater than or equal to 5 mm. In this way, when the glass substrate 21 and the mask are pressed, the first protrusion 112 may be moved to the predetermined position in the groove 114 and be fixed by the screw. In specific embodiments, the predetermined position is a position at which the deformation of the glass substrate 21 may be prevented. That is, the predetermined position is a position at which the vertical distance H between the first protrusions 112 and the edge of the mask 12 is greater than or equal to the preset distance. The predetermined position may be set by the first protrusion 112 moving in the groove 114 without limitation.

In specific embodiments, the groove 114 is defined along a long side direction of the bottom plate 11, and the width L of the groove 114 perpendicular to the long side direction of the bottom plate 11 is greater than or equal to 5 mm and less than or equal to 20 mm. Specifically, the amplitude of the vertical distance between the bottom plate protrusion 111 disposed adjacent to the edge of the back plate 22 or the first protrusion 112 and the edge of the mask 12 may be obtained through multiple experiments. It can be understood that this amplitude is optimized when the attachment effect between the glass substrate 21 and the mask 12 may be improved most efficiently. A maximum width of the groove 114 is determined based on the amplitude. For example, in some embodiments, the maximum width of the groove 114 may be 15 mm, that is, the width of the groove 114 is greater than or equal to 5 mm and less than or equal to 15 mm. In other embodiments, the maximum width of the groove 114 may be 18 mm. That is, the width of the groove 114 is greater than or equal to 5 mm and less than or equal to 18 mm, which is not specifically limited.

In specific embodiments, the height of the first protrusions 112 is greater than the height of the bottom protrusions 111. Specifically, the height of the first protrusions 112 minus the depth of the groove 114 is equal to the height of the bottom protrusions 111. That is, when the glass substrate 21 is pressed, both the first protrusions 112 and the bottom protrusions 111 are in contact with the glass substrate 21.

In specific embodiments, each of the first protrusions 112 disposed adjacent to the edge is a cuboid. Specifically, a connecting portion 117 is arranged between adjacent two first protrusions 112 to connect the first protrusions 112 disposed adjacent to the edge. In this way, when the first protrusions 112 are moved in the groove 114, all the first protrusions 112 disposed adjacent to the edge may be moved at the same time to prevent that the first protrusions 112 on the same column or row are not on a same straight line, and avoid that deformation cannot be eliminated.

A height of the connecting portion 117 connecting with the first protrusions 112 and the height of the first protrusions 112 may be the same, so that when the glass substrate 21 and the mask 12 are pressed, both the first protrusions 112 and the connecting portions 117 are in contact with the glass substrate 21. In other embodiments, the height of the connecting portions 117 connecting with the first protrusions 112 is lower than the height of the first protrusions 112, so that when the glass substrate 21 and the mask 12 are pressed, only the first protrusions 112 contacts the glass substrate 21, and the connecting portions 117 may not contact with the glass substrate 21.

In some embodiments, the grooves 114 are defined in at least two opposite sides of the bottom plate 11. The bottom plate 11 may be rectangle, specifically, the bottom plate 11 may be a cuboid or cube, which is not specifically limited. The embodiments are described by taking the bottom plate 11 of a cuboid as an example. Specifically, the grooves 114 may be defined on two sides of edges of long sides of the bottom plate 11. Specifically, the grooves 114 are arranged along the long sides of the bottom plate 11 as shown in FIG. 3. In this way, when the first protrusions 112 are adjusted in position, the first protrusions 112 move in a direction perpendicular to the long sides of the bottom plate 11. In other embodiments, the grooves 114 may be defined along the short sides of the bottom plate 11, so that when the first protrusions 112 are adjusted in position, the first protrusions 112 move in a direction perpendicular to the short sides. The positions of the grooves 114 are not limited, as long as the deformation may be eliminated and the attachment accuracy of the glass substrate 21 and the mask 12 may be improved.

In specific embodiments, the size and shape of each of the first protrusions 112 may be the same as those of each of the bottom protrusions 111. In some embodiments, the size of each of the first protrusions 112 may be larger than that of each of the bottom protrusions 111. In some embodiments, the shape of each of the first protrusions 112 is different from that of each of the bottom plate protrusions 111, which is not specifically limited. For example, in some embodiments, the shape of each of first protrusions 112 may be set as a cuboid, but the shape of each of bottom plate protrusions 111 may be set as a cylinder.

In some embodiments, the first protrusions 112 and the bottom plate protrusions 111 are arranged in the same manner and same distribution. In some embodiments, the first protrusions 112 and the bottom plate protrusions 111 are equally distributed, so that the pressure applying on the glass substrate 21 is uniform. In this manner, the height of each of the connecting portions 117 connecting to the two adjacent first protrusions 112 may be lower than the height of each of the first protrusions 112 so that each of the connecting portions 117 do not contact with the glass substrate 21.

In other embodiments, the first protrusions 112 and the bottom plate protrusions 111 are arranged in a different manner. That is, the arrangement of the first protrusions 112 may be more dispersed, while the arrangement of the bottom plate protrusions 111 may be relatively dense. In this manner, the height of each of the connecting portions 117 connecting to the adjacent two first protrusions 112 may be equal to the height of each of the first protrusions 112 and the connecting portions 117 contact with the glass substrate 21, so that the pressure applied on the glass substrate 21 is as uniform as possible.

Figure 4:
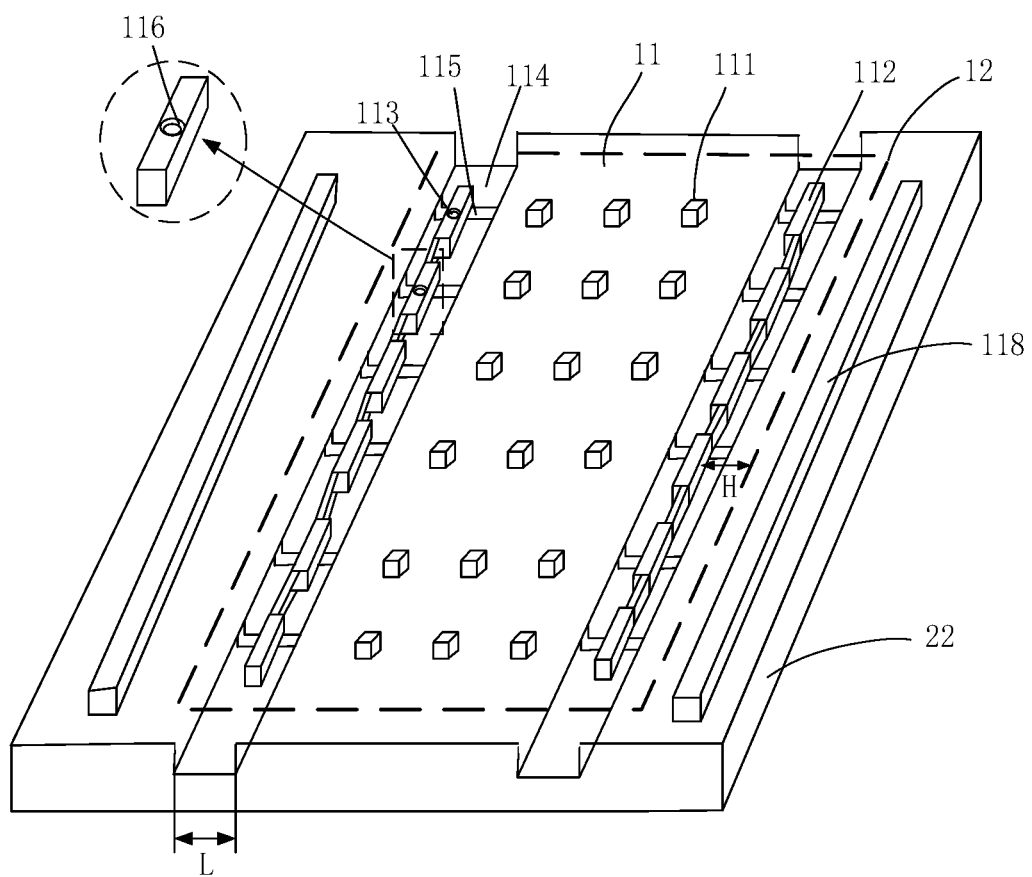
FIG. 4 is a structural schematic view of a back plate further defining grooves and disposed with first protrusions and limiter bars based on the back plate shown in FIG. 1.

FIG. 4 is a structural schematic view of a back plate according to another embodiment of the present disclosure. The back plate 22 shown in the FIG. 4 has all the technical features of the embodiment shown in the FIG. 3. The back plate 22 shown in FIG. 3 further includes a limiter bar 118 arranged adjacent to an outer side of the first protrusions 112. Specifically, the limiter bar 118 is disposed outside the first protrusions 112 and on a long side of the bottom plate 11, and extends along the long side. In other embodiments, the limiter bar 118 may be disposed on a short side of the bottom plate 11 and extends along the short side.

In some embodiments, the height of the limiter bar 118 is lower than the height of each of the bottom plate protrusions 111. Specifically, when the glass substrate 21 and the mask 12 are not pressed together, the first protrusions 112 and the bottom plate protrusions 111 contact with the glass substrate 21, and the limiter bar 118 does not contact with the glass substrate 21. In the process of applying pressure to press the glass substrate 21 and the mask 12, the glass substrate 21 is deformed and contacts with the limiter bar 118, the glass substrate 21 is positionally limited by the limit bar 118 and may not be deformed any more. That is, the height of the limiter bar 118 is set according to an appropriate deformation value of the glass substrate 21, and the appropriate deformation value of the glass substrate 21 does not affect the attachment accuracy of the glass substrate 21 and the mask 12.

In the back plate 22 shown in some embodiments, under the condition that the height of the limiter bar 118 remains unchanged, the groove 114 may be defined on an inner side of the limiter bar 118, and the first protrusions 112 may move in the groove 114, so that the vertical distance H between the first protrusions 112 disposed adjacent to the edge and the edge of the mask 12 is greater than or equal to the preset distance. In this way, the deformation of the part of the glass substrate 21 facing a surrounding of the inner edge of the frame of the mask 12 can be reduced under the condition that the height of the limiter bar 118 remains unchanged, the attachment effect of the mask 12 and the glass substrate 21 is improved, thereby increasing the product yield.

In some embodiments, the height of the limiter bar 118 is less than that of each of the bottom plate protrusions 111. Referring to the FIG. 1, the limiter bar is disposed adjacent to the outer side of the bottom plate protrusions 111 and on the long side of the bottom plate 11. The vertical distance H between the bottom plate protrusions 111 disposed adjacent to the edge and the edge of the mask 12 is greater than or equal to the preset distance. In this way, the deformation of the part of the glass substrate 21 facing the surrounding of the inner edge of the frame of the mask 12 may be reduced under the condition that the height of the limiter bars 118 remains unchanged, and the attachment effect of the mask 12 and the glass substrate 21 may be improved, thereby increasing the product yield.

The back plate 22 in the present disclosure is arranged with a plurality of protrusions 10 arranged in an array on the side of the bottom plate 11 facing the glass substrate 21. The protrusions 10 include the first protrusions 112 disposed adjacent to the edge portion of the bottom plate 11 and the bottom plate protrusions 111 disposed on other positions except the position adjacent to the edge portion of the bottom plate 11. In some embodiments, the vertical distance H between the first protrusions 112 disposed adjacent to the edge and the edge of the mask 12 is greater than or equal to a preset distance to reduce the deformation of the part of the glass substrate facing the surrounding of the inner edge of the frame of the mask 12. In this way, the attachment effect between the mask 12 and the glass substrate 21 may be improved, thereby increasing the product yield. As to the back plate 22 of the present disclosure, the deformation of the part of the glass substrate 21 facing the surrounding of the inner edge of the frame of the mask 12 may be reduced, when the height of the limiter bar 118 is lower than the bottom plate protrusions 111 or the first protrusions 112, the attachment effect between the mask 12 and the glass substrate 21 may be improved, thereby increasing the product yield.

In some embodiments, the back plate 22 may not be changed, but a frame of the mask 12 may be enlarged. Specifically, the mask 12 includes the frame and a mask body. The frame of the mask 12 and the mask 12 may be expanded, so that the vertical distance H between the edge of the mask 12 and the first protrusions 112 disposed adjacent to the edge of the back plate 22 is greater than or equal to the preset distance. In some embodiments, the vertical distance H between the edge of the mask 12 and the first protrusions 112 disposed adjacent to the edge of the back plate 22 is greater than or equal to a preset distance and less than or equal to 20 mm.

The above description shows only an implementation of the present disclosure, and does not limit the scope of the present disclosure. Any equivalent structure or equivalent process transformation based on the content of the specification and the accompanying drawings, or directly or indirectly applied in other related technical field, shall be included in the scope of the present disclosure.

What is claimed is:

1. A back plate, configured to press a mask assembly comprising a glass substrate and a mask stacked on the glass substrate, the back plate covering a surface of the glass substrate to press the glass substrate, thereby attaching the glass substrate to the mask, the back plate comprising:
   a bottom plate; and
   a plurality of protrusions, the plurality of protrusions comprising a plurality of bottom plate protrusions disposed on a side of the bottom plate facing to the glass substrate; the plurality of bottom plate protrusions arranged in an array; wherein orthographic projections of the plurality of bottom plate protrusions on the mask fall within the mask, and a distance between the orthographic projections of the plurality of bottom plate protrusions disposed adjacent to an edge of the mask and the edge of the mask is greater than or equal to a preset distance;
   wherein the plurality of protrusions further comprise a plurality of first protrusions disposed adjacent to an edge portion of the bottom plate, and the edge portion of the bottom plate defines a plurality of grooves corresponding to the plurality of first protrusions, the plurality of first protrusions are slidably disposed in the plurality of grooves; and
   the plurality of first protrusions are slidable in a width direction along a surface of the bottom plate.

2. The back plate according to claim 1, wherein a height of one of the plurality of first protrusions minus a depth of a corresponding groove is equal to a height of one of the plurality of bottom plate protrusions.

3. The back plate according to claim 1, wherein the grooves extend along a longer side of the bottom plate, a width of the grooves perpendicular to the long side of the bottom plate is greater than or equal to 5 mm, and the bottom plate protrusions on the bottom plate are arranged in the array and uniformly disposed.

4. The back plate according to claim 1, wherein a plurality of threaded grooves are defined in the grooves along a width direction, and the number of the plurality of threaded grooves is equal to the number of the plurality of first protrusions; each of the plurality of first protrusions is movable along the width direction of a corresponding threaded groove; when each of the plurality of first protrusions moves to a predetermined position, the first protrusion is fixed at a position of the corresponding threaded groove.

5. The back plate according to claim 4, wherein the grooves are arranged along a longer side of the bottom plate; when each of the plurality of first protrusions is adjusted, each of the plurality of first protrusions moves along a direction perpendicular to the longer side of the bottom plate.

6. The back plate according to claim 4, wherein the grooves are arranged along a shorter side of the bottom plate, when each of the plurality of first protrusions is adjusted, each of the plurality of first protrusions moves along a direction perpendicular to the shorter side of the bottom plate.

7. The back plate according to claim 4, wherein each of the plurality of first protrusions disposed in a corresponding groove defines a corresponding threaded hole extending through each of the plurality of first protrusions, and each of the plurality of first protrusions is fixed in the corresponding groove by a corresponding screw penetrating through the corresponding threaded hole and inserted into the corresponding threaded groove.

8. The back plate according to claim 7, wherein a length of the corresponding screw is less than a sum of a depth of the corresponding threaded hole and a depth of the corresponding threaded groove defined in the corresponding groove.

9. The back plate according to claim 7, wherein a surface of each of the plurality of first protrusions away from the bottom plate define a corresponding receiving groove at a position corresponding to the corresponding threaded hole;
   when each of the plurality of first protrusions is fixed at the back plate by the corresponding screw, the corresponding screw is received in the corresponding receiving groove.

10. The back plate according to claim 7, wherein, the corresponding threaded groove is elliptical, and a length of a longer axis of the corresponding thread groove is equal to a width of the corresponding groove.

11. The back plate according to claim 1, wherein the preset distance is 3 mm.

12. The back plate according to claim 1, wherein a connecting portion is disposed between adjacent two of the plurality of first protrusions to connect the adjacent two of the plurality of first protrusions to each other, a height of the connecting portion connecting with the adjacent two of the plurality of first protrusions and the height of the adjacent two of the plurality of first protrusions are the same.

13. The back plate according to claim 1, wherein at least opposite two sides of the bottom plate define the plurality of grooves.

14. The back plate according to claim 1, wherein a limiter bar is disposed adjacent to an outer side of the plurality of first protrusions away from a center of the bottom plate, and a height of the limiter bar is less than a height of one of the plurality of first protrusions.

15. The back plate according to claim 14, wherein the limiter bar is arranged along a longer side direction of the bottom plate.

16. The back plate according to claim 14, wherein the limiter bar is arranged along a shorter side direction of the bottom plate.

17. The back plate according to claim 1, wherein the mask comprises a frame and a mask body, the frame and the mask body is capable of being expanded.

18. The back plate according to claim 1, wherein a limiter bar is disposed near an outer side of the plurality of bottom protrusions away from a center of the bottom plate, and the grooves are defined on an inner side of the limiter bar.

19. The back plate according to claim 18, wherein the limiter bar is arranged along a longer side direction of the bottom plate, and a height of the limiter bar is less than a height of one of the plurality of first protrusions.

20. The back plate according to claim 1, wherein
   the plurality of first protrusions and the bottom plate protrusions are arranged in a different manner, the arrangement of the plurality of first protrusions is more dispersed, while the arrangement of the bottom plate protrusions is relatively dense.

* * * * *